United States Patent [19]

Lissalde et al.

[11] Patent Number: 4,660,149
[45] Date of Patent: Apr. 21, 1987

[54] CONTROL PROCESS FOR A MONOCRYSTAL PULLING MACHINE

[75] Inventors: Francois Lissalde, Seyssins; Delageniere Bruno, Grenoble; Ferrieu Bruno, Seyssinet, all of France

[73] Assignee: Societe Crismatec, France

[21] Appl. No.: 659,438

[22] Filed: Oct. 10, 1984

[30] Foreign Application Priority Data

Oct. 19, 1983 [FR] France .................. 83 16634

[51] Int. Cl.⁴ ............... G05B 11/00; B01J 17/00
[52] U.S. Cl. ................... 364/477; 364/468; 422/249; 156/601
[58] Field of Search ........... 364/468, 477; 422/249; 156/601, 617 R, 617 SP, 624, 621, 622

[56] References Cited

U.S. PATENT DOCUMENTS

| | | | |
|---|---|---|---|
| 3,621,213 | 11/1971 | Jen | 364/468 |
| 3,761,692 | 9/1973 | Cope | 364/477 |
| 4,008,387 | 2/1977 | Green et al. | 364/477 |
| 4,032,386 | 6/1977 | Joyce | 156/601 |
| 4,176,002 | 11/1979 | Quenisset | 156/618 |
| 4,207,293 | 6/1980 | Scholl | 156/617 SP |
| 4,258,003 | 3/1981 | Hurle | 156/601 |
| 4,539,067 | 9/1985 | Washizuka | 156/601 |
| 4,565,598 | 1/1986 | Seymor | 156/617 SP |

Primary Examiner—Jerry Smith
Assistant Examiner—Allen MacDonald

[57] ABSTRACT

The invention relates to a process for the control of a monocrystal pulling machine.

The process consists of recording in a computer memory parameters relating to the geometry of the monocrystal and the growth thereof, signals representative of the weight of the crystal and processed by processing circuits, then recording in said memory a programme so that the computer successively controls the raising to the appropriate temperature of the heating means for successively bringing about the melting of the product for forming the monocrystal, a fast automatic approach of the product bath by a pin carrying a nucleus up to a predetermined distance from the surface of said bath. Finally, the process consists of controlling a slower bath approach until the nucleus is in contact with the bath surface. Following this contact, the temperature of the heating means is automatically regulated for a zero growth of the crystal, the automatic pulling of the crystal and the cooling of the heating means at the end of pulling.

Application to the pulling of monocrystals.

12 Claims, 13 Drawing Figures

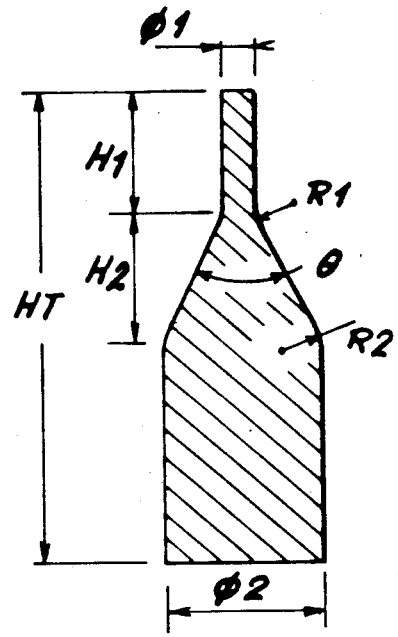
FIG.4
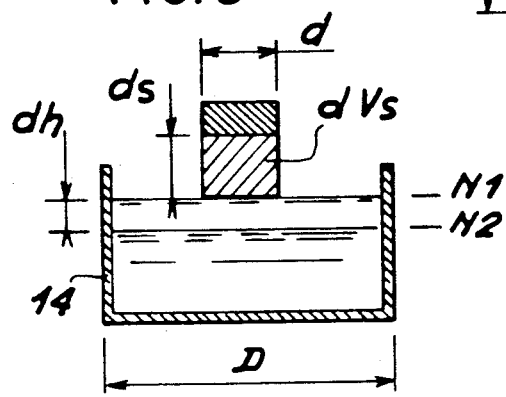
FIG.5
FIG.6
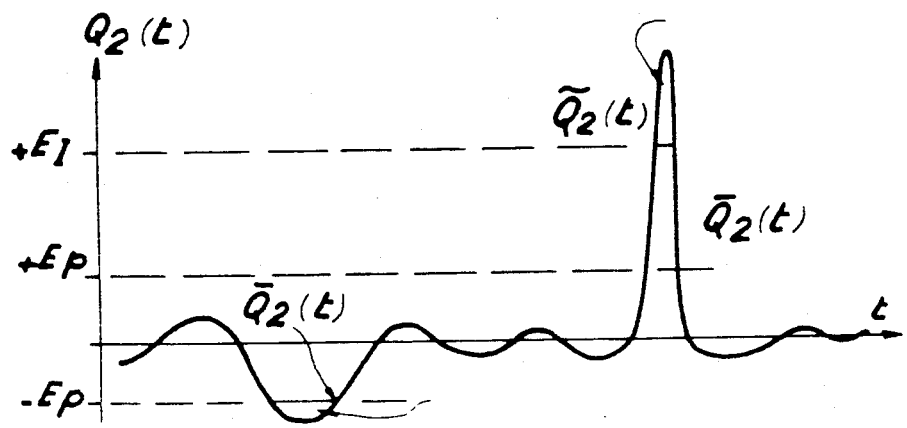

(I) A + 1 = 12

| N | 1 | 2 | 3 | 4 | 5 | 6 | 7 | 8 | 9 | 10 | 11 |
|---|---|---|---|---|---|---|---|---|---|---|---|
| M | 11 | 10 | 9 | 8 | 7 | 6 | 5 | 4 | 3 | 2 | 1 |
| $\frac{\sigma S}{\Delta P}$ | 11 | 14,14 | 15,59 | 16 | 15,65 | 14,70 | 15,65 | 16 | 15,59 | 14,14 | 11 |

(II) A + 1 = 24

| N | 1 | 2 | 3 | 4 | 5 | 6 | 7 | 8 | 9 | 10 | 11 | 12 |
|---|---|---|---|---|---|---|---|---|---|---|---|---|
| M | 23 | 22 | 21 | 20 | 19 | 18 | 17 | 16 | 15 | 14 | 13 | 12 |
| $\frac{\sigma S}{\Delta P}$ | 23 | 31,11 | 36,37 | 40 | 42,49 | 44,09 | 44,98 | 45,25 | 45 | 44,27 | 43,12 | 41,57 |

GENERAL FLOW-CHART OF THE PROCESS

CONTROL PROCESS FOR A MONOCRYSTAL PULLING MACHINE

BACKGROUND OF THE INVENTION

The present invention relates to a control process for a monocrystal pulling machine.

This process makes it possible to pull monocrystals from a bath of molten products. These monocrystals are essentially used for the production of integrated circuits. This process is performed by a pulling machine, in which the molten product bath is contained in a crucible and is kept at a temperature above the melting point of the product by appropriate heating means. The solid crystal or ignot is obtained by the growth of a monocrystalline nucleus of the same product, placed at the lower end of a vertically axed pulling pin or spindle, in accordance with the so-called Czochralski method, which is known in the art and will not be described in detail here.

Pulling machines operating according to the Czochralski method are fundamentally used in the crystallization of materials for which, in the crystallized solid state, said materials have the same composition as in the liquid state. It is then said that these materials have a congruent melt. For example, this is the case with certain oxides, as well as semiconductors of the silicon or germanium type.

In known machines making it possible to pull monocrystals according to the Czochralsky method, the monocrystalline nucleus is brought into contact with the liquid bath, whose temperature is adjusted in such a way that, at the solid-liquid interface, the conditions are such that at any time the quantity of crystallized atoms is identical with the quantity of atoms returning into the molten state. Growth is obtained by exerting a regular vertical translation movement at a speed which is generally between 1 and 30 mm per hour on a pulling spindle or pin, one end of which makes it possible to fix the nucleus. In order to check the shape of the solid-liquid interface, a rotary movement of the pin about its axis at a speed generally between 0 and 100 revolutions per minute is superimposed on the translatory movement thereof.

The upward displacement of the solid-liquid interface bring the latter into a colder zone, which has the effect of crystallizing the bath on the nucleus and consequently of growing the monocrystal, with the aim of forming therefrom a cylindrical ingot, which has a diameter which is as constant as possible.

The need for obtaining monocrystals with a regular geometry has led machine designers to seek control processes leading to monocrystal diameter regularity during the pulling thereof. This regularity is generally also obtained on the basis of measurements of the weight of the monocrystal during pulling. To this end, a weight transducer is generally placed at one end of the pulling pin and transmits signals representing weight values to a processing and control assembly, which make it possible to check the translation and rotation of the pin. The known machines are not completely automatic, because the processes performed by them do not use adequate processing of the weight information during pulling and information regarding the geometry of the crystal to be obtained. Thus, the regulation of the heating means containing the crucible, the fast and then slow approach of the surface of the molten product contained in the crucible, the contact between the nucleus and the surface of the molten product, the pulling of the monocrystal after contact has taken place and then the cooling of the furnace at the end of pulling are not completely automatic operations and these are often performed in an empirical manner. Thus, the results obtained are of a random nature, which is a serious disadvantage, because the monocrystals to be obtained are very expensive products.

SUMMARY OF THE INVENTION

The object of the invention is to obviate these disadvantages by means of a process for controlling a monocrystal pulling machine and which make the latter completely automatic. On the basis of parameters relating to the monocrystal geometry, this process consists of obtaining the growth thereof and processing signals representing the evolution of the monocrystal weight during pulling for automatically controlling the temperature regulation of the heating means and for automatically controlling the translatory and rotary movements of the pin, as well as the translatory movement of the crucible, from the time where the product is placed in the crucible in which melting takes place up to the time when the monocrystal ingot is obtained by pulling.

The present invention therefore relates to a process for the control of a monocrystal pulling machine comprising a crucible containing a bath of a molten product and stabilized to a temperature above the melting point of the product by heating and temperature regulating and measuring means, pulling being carried out with the aid of a monocrystalline nucleus of the product placed at the lower end of a vertically axed pulling pin, the machine also comprising a fixed frame, a carriage which moves relative to the frame parallel to the axis of the pulling pin, means for controlling the translation of the carriage in accordance with at least two different speeds, means for controlling a translation of the crucible parallel to the pin axis, the carriage supporting the pulling pin via means for controlling the rotation thereof about its own axis, the pulling pin comprising a weight transducer supplying signals representing the weight of the pin and the nucleus prior to pulling and the evolution of said weight during pulling, said signals being applied to electronic processing circuits connected to a computer for checking the regulation of the heating means and checking the means for controlling the translation of the carriage, the translation of the crucible and the rotation of the pin, wherein the process comprises recording in a computer memory parameters relating to the geometry of the monocrystal and the growth thereof, signals representing the weight and processed by the processing circuit and recording in said memory a programme to ensure that the computer successively controls the raising to the appropriate temperature of the heating means for bringing about the melting of the product, a fast automatic approach of the bath by the pin provided with the nucleus up to a predetermined distance from the surface of said bath, a slower approach of the bath until the nucleus is in contact with the bath surface and, following said contact, an automatic regulation of the temperature of the heating means or a zero growth of the crystal, followed by the automatic pulling of the crystal, the cooling of the heating means at the end of pulling, the slow and fast approaches and pulling being performed as a result of the action of the computer on the means for controlling the translation of the carriage and the crucible and the rotation of the pin.

According to another feature, the detection of the contact between the nucleus and the surface of the bath consists of detecting a singularity in the signals representing the weight of the pin and the nucleus at the time of contact between the nucleus and the surface of the molten products, the amplitudes of said signals and of said singularity being between two predetermined upper and lower limits.

According to another feature, the automatic regulation of the heating means for a zero growth of the monocrystal consist, following detection of the singularity, determining on the basis of signals supplied by the transducer, the differences of weight derivatives relative to time for a predetermined sampling period and then, following clipping operations, applying a proportional and integral action to the function representing said differences in the weight derivatives relative to time, the clipping operations differing as a function of whether the difference of the weight derivative is applied to the proportional action or to the integral action, the thus processed function representing a reference voltage of the heating means for a zero growth of the monocrystal, the amplitudes of the signal supplied by the transducer being between the two predetermined limits during said regulation operation.

According to another feature, if the heating conditions at the start of the zero growth regulation sequence are too far removed from conditions making it possible to keep the signal supplied by the transducer between two predetermined limits, the process consists of lowering the temperatures of the heating means when the amplitudes of the signals supplied by the transducer are below the lower limit and increasing said temperature when the amplitudes of the signals supplied by the transducer are above the upper limit.

According to another feature, pulling consists, by the translation of the pin and crucible and checking the heating power, imposing a variation on the weight derivative of the crystal during pulling by comparison of these derivatives with reference weight derivatives, the regulation of the temperature of the heating means being obtained from the function representing variations in the weight derivatives processed again by the succession of operations clipping, proportional action and integral action occurring in the control loop.

According to another feature, the process also consists of suspending the controls of the computer in the case of an incident or for introducing new regulating, control or pulling parameters into the memory.

BRIEF DESCRIPTION OF THE DRAWINGS

The invention is described in greater detail hereinafter relative to non-limitative embodiments and the attached drawings, wherein show:

FIG. 4 diagrammatically, a monocrystal ingot obtained according to the process of the invention performed in the aforementioned machine.

FIG. 5 provides a better understanding of the calculation of the translation speeds of the pin and the crucible for the aforementioned machine performing the process according to the invention.

FIG. 6 a graph providing a better understanding of the way in which the signals involved in the proportional and integral actions are clipped and which, according to the process of the invention, make it possible to regulate the temperature of the heating means of the machine.

DETAILED DESCRIPTION OF THE PREFERRED EMBODIMENTS

The pulling machine in which is performed the process of the present invention is more particularly that described in U.S. patent application having Ser. No. 647,178 filed Sept. 4, 1984 in the name of the same applicant.

The pulling machine making it possible to perform the process of the invention essentially differs from the known machines with respect to the pulling head, i.e. the means making it possible to control the vertical translation of the pulling pin or spindle along its axis and means for controlling the rotation of said pin or spindle about said axis.

Moreover, when the molten bath is converted into a monocrystal during the rise of the pulling pin, there is a drop in the level of said bath in the crucible which requires a slow upward movement of the crucible in order to keep constant the growth speed of the crystal and to maintain the position of the solid-liquid interface fixed in the heat gradient. The means for controlling the displacement of the crucible will not be described in detail here.

Figure 1:
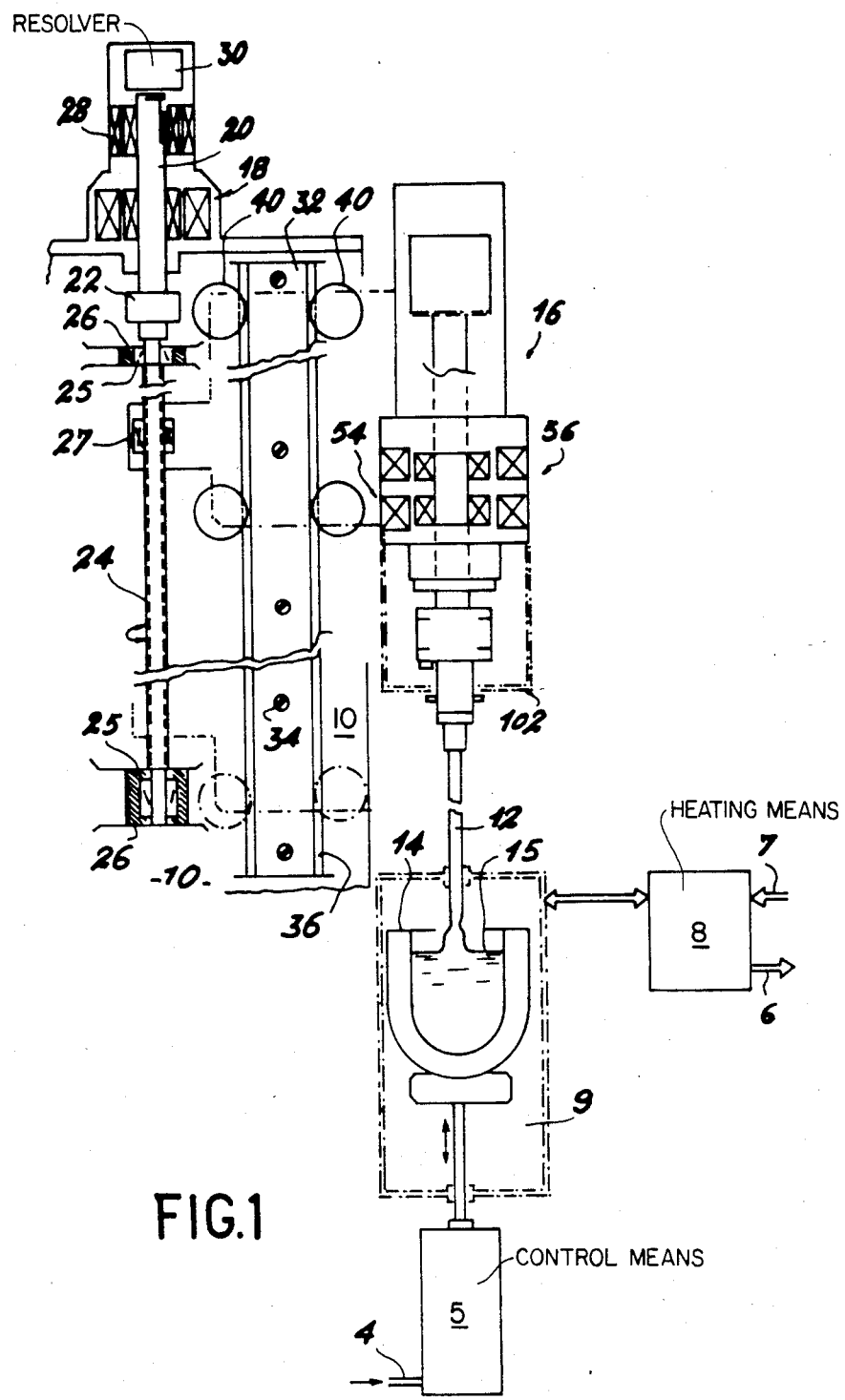
FIG. 1 a front view diagrammatically representing a monocrystal pulling machine in which the process according to the invention is performed.

FIG. 1 shows part of the machine frame 10 supporting the vertically axed pulling pin 12 above the crucible 14, which is filled with a bath 15 of molten product to be crystallized, by means of a carriage 16 which is vertically movable with respect to frame 10. The crucible is located in a diagrammatically represented furnace 9, which is associated with high frequency or resistive heating means which are not described in detail here. These means 8 receive regulating or control signals at their input 7 and supply measurement signals at their outputs 6. The crucible can be displaced in translation parallel to the pulling pin 12 by control means 5. On inputs 4, these means receive checking signals supplied by a computer, as will be shown in greater detail hereinafter.

The control of the vertical displacement of carriage 16 relative to frame 10 is brought about by a torque motor 18 mounted in the upper part of the frame, so as to directly rotate a vertically axed shaft 20, whose lower end is joined by a coupling 22 to a vertically axed threaded rod 24, mounted in rotary manner in journals 26 integral with frame 10, via bearings 25. Like all the other machine bearings, bearings 25 are clearance-free bearings with an oblique contact or a deep groove.

A nut 27, integral with carriage 16 is received on the threaded rod 24, in such a way that the rotation thereof by torque motor 18 has the effect of bringing about a vertical translatory movement of carriage 16.

The use of a torque motor 18 permits the particularly gentle movements and eliminates the reduction gears and clutches used in known machines. Moreover, a single torque motor makes it possible to control both the slow displacements (translation speed which, as required, can be between 1 and 30 mm per hour for pulling) and the fast displacements (translation speed of 95 mm/minute for the approach) of the pulling pin.

In order to ensure the regularity of these displacements, particularly during the pulling of the monocrystal, the torque motor 18 is controlled in speed and position. To this end, a speed transducer, such as a tachometer dynamo and a position coder such as synchro-resolver 30 are associated with motor 18. For simplification purposes, FIG. 1 does not show the feedback loops by which the signal supplied by the tachometer dynamo and the synchro-resolver make it possible to control the speed and position of torque motor 18. Such feedback loops are known and not described in detail.

The control of the torque motor 18 from the control cabinet, in order to regulate the speed and displacement directions of the pulling pin 12 can be realised by any appropriate means and will not be described in detail here.

The vertical translation of the carriage 16 carrying the pulling pin 12, relative to frame 10, is guided by appropriate means separate from the screw-nut assembly 24, 27. In the embodiments shown in FIGS. 1 and 2, these guidance means are constituted by a rail or a trued vertical slide 32 fixed to frame 10, e.g. by means of screws 34 and whereof the vertical edges 36 have a V-shaped section. These edges 36 of rail 32 penetrate grooves 38 of the same section formed in at least two pairs of vertically displaced trued rollers 40. The spindles 42 of rollers 40 are integral with carriage 16.

Obviously, these guidance means could be constituted by any equivalent means and particularly by an air cushion guidance system making it possible to reduce friction and consequently further improve the regularity of the displacement of carriage 16 relative to the frame.

No matter what the guidance means used, it should be noted that the displacement of the carriage relative to the frame takes place without jerks or vibrations, which is an important advantage compared with the prior art.

Figure 2:
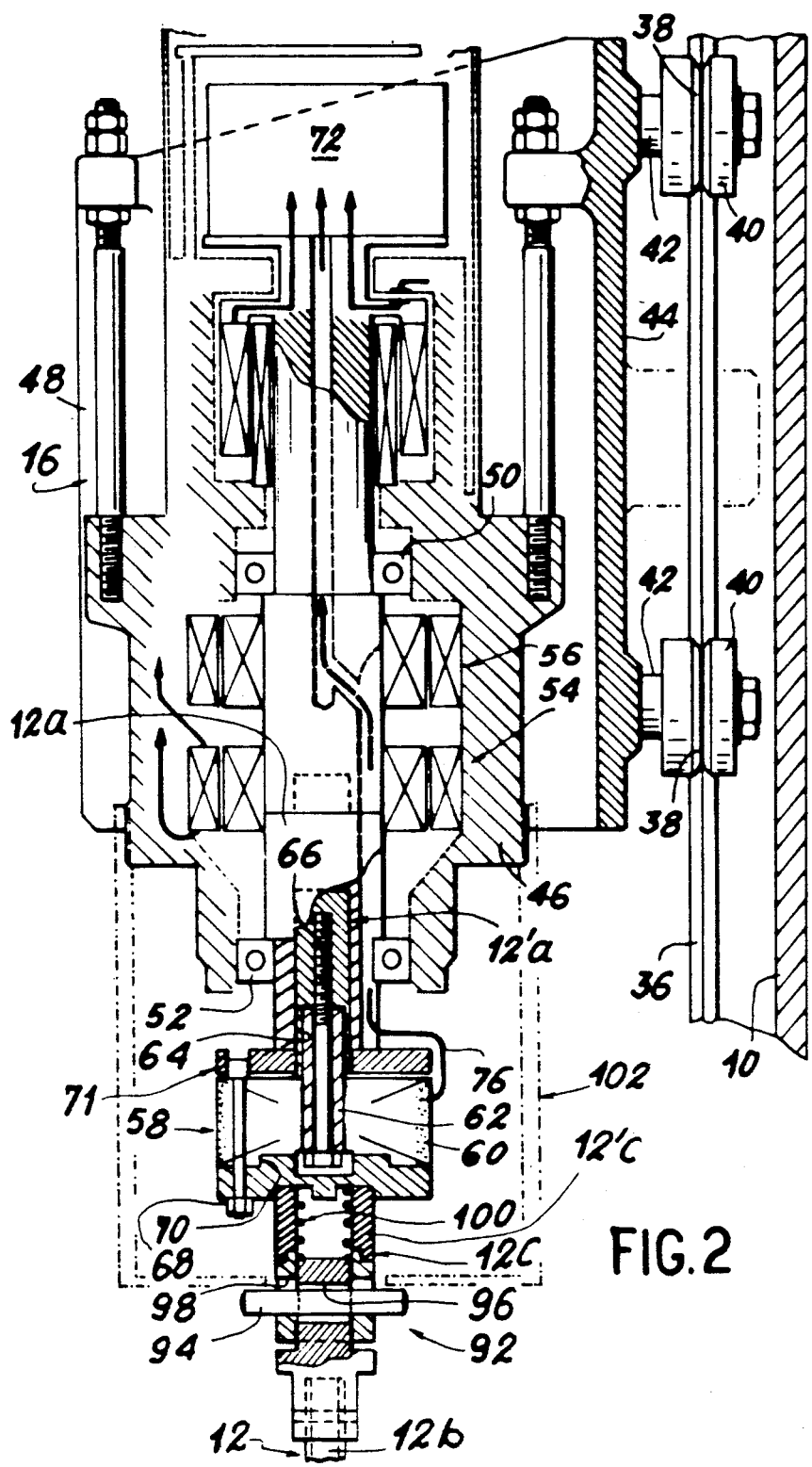
FIG. 2 a side view, partly in section and on a larger scale, showing in greater detail the upper part of the pulling pin or spindle and the carriage supporting it in the said machine.

As is more particularly shown by FIG. 2, the carriage 16 comprises a first part 44 carrying nut 27 and spindles 42 supporting the guidance rollers 40 and a second part 46 having in general manner a symmetry of revolution about the vertical axis of the pulling pin 12. Part 46 of the carriage is suspended on part 44 by rigid tie bolts 48, which have a regulatable length and are circumferentially distributed around the pin, so as to permit a very precise adjustment of the vertical orientation of the pin axis.

It can also be seen from FIG. 2 that the upper portion of the pulling pin 12 penetrates carriage part 46, in which it is suspended in rotary manner by means of an abutment 52 and a bearing 50, which is also clearance-free. Pin 12 is rotated within carriage part 46 by means of a second torque motor 54, which is speed-controlled by means of a speed transducer, such as a tachometer dynamo 56 and a known, not shown feedback circuit. It should be noted that the torque motor 54 is directly engaged on pin 12. In the same way as for motor 18, motor 54 can be controlled by any appropriate means and will not be described in detail here.

As in the case of the translation control motor 18, torque motor 54 permits a particularly gentle movement and eliminates any mechanical reduction gear. Torque motor 54 makes it possible to impart a rotary movement regulatable between 0 and 100 revolutions per minute to the pulling spindle.

The speed stability obtained through using torque motors 18 and 54 is better than 2.5%, which is a much better result than that obtained with known pulling machines, the machine described here having no intensifier.

In order to bring about the automatic immersion or dipping of the nucleus in the bath contained in the crucible, a weight transducer 58 is directly placed in the pulling pin 12.

During the growth of the crystal and as will be shown in greater detail hereinafter, the weighing operation performed with the aid of transducer 58 represents allowing for the weight of the lower part of the pulling pin, the weight of the monocrystal and consequently it makes it possible to act on the heating power of the crucible in order to regulate the diameter of the crystal obtained. The transducer 58 has a special structure making it possible to prevent any disturbing displacement between the axes of the two parts of the pin connected by the transducer.

In known manner, the weight transducer 58 comprises an outer part 60 and an inner part 62, between which are located not shown deformation transducers, such as strain gauges.

In order to improve the alignment of the axes of the upper part 12a and the lower part 12b of the pulling pin 12, FIG. 2 shows that the central part 62 is extended upwards and projects above the upper face of the outer part 60 and enters a blind hole 64 formed in pin part 12a, to which it is fixed by a screw 66. In a comparable manner, the outer part 60, which is fixed to the lower part 12b of the pulling spindle by means of screws 68, is centered relative to said part 12b by a dimpling 70. Thus, the alignment of the axes of these two pulling pin parts can be very accurately obtained.

FIG. 2 also shows that a disk 71, of the same diameter as the outer part 60, is fixed above the latter to the lower end of pin part 12a, e.g. using not shown screws. This disk 71, which defines a relatively small gap with part 60, constitutes an abutment which counterbalances the radial or compressive stresses, which might accidentally be applied to the transducer. To ensure a good efficiency of this abutment, the gap between disk 71 and part 60 is preferably limited to approximately 1/10 mm.

In order to improve the stability of the system with respect to surrounding thermal fluctuations, FIG. 2 shows that weight transducer 58, as well as all the guidance pin area located between the lower end of carriage part 46 and the dismantlable device 92, which will be described hereinafter, are located in an enclosure 102. The inner and outer faces of the enclosure 102 are made from polished aluminium.

Moreover, means are provided for regulating the temperature within enclsoure 102. These means comprise a thermometer probe 104 and a heating member 106 fixed to the interior of enclosure 102, as well as an electronic regulating circuit 108 located in the not shown control console. Probe 104 and heating member 106 are electrically connected to circuit 108, as is diagrammatically shown in FIG. 3, in such a way that the heating member, controlled by circuit 108, makes it possible to stabilize the temperature as a function of information supplied by the thermometer probe. The temperature on the weight transducer can consequently be stabilized e.g. to approximately 35° C. Moreover, in order to eliminate the heat bridges existing in the external medium and the weight transducer 58, parts 12'a and 12'c of the pulling pin adjacent to the transducer are made from an insulating material, such as alumina.

Figure 3:
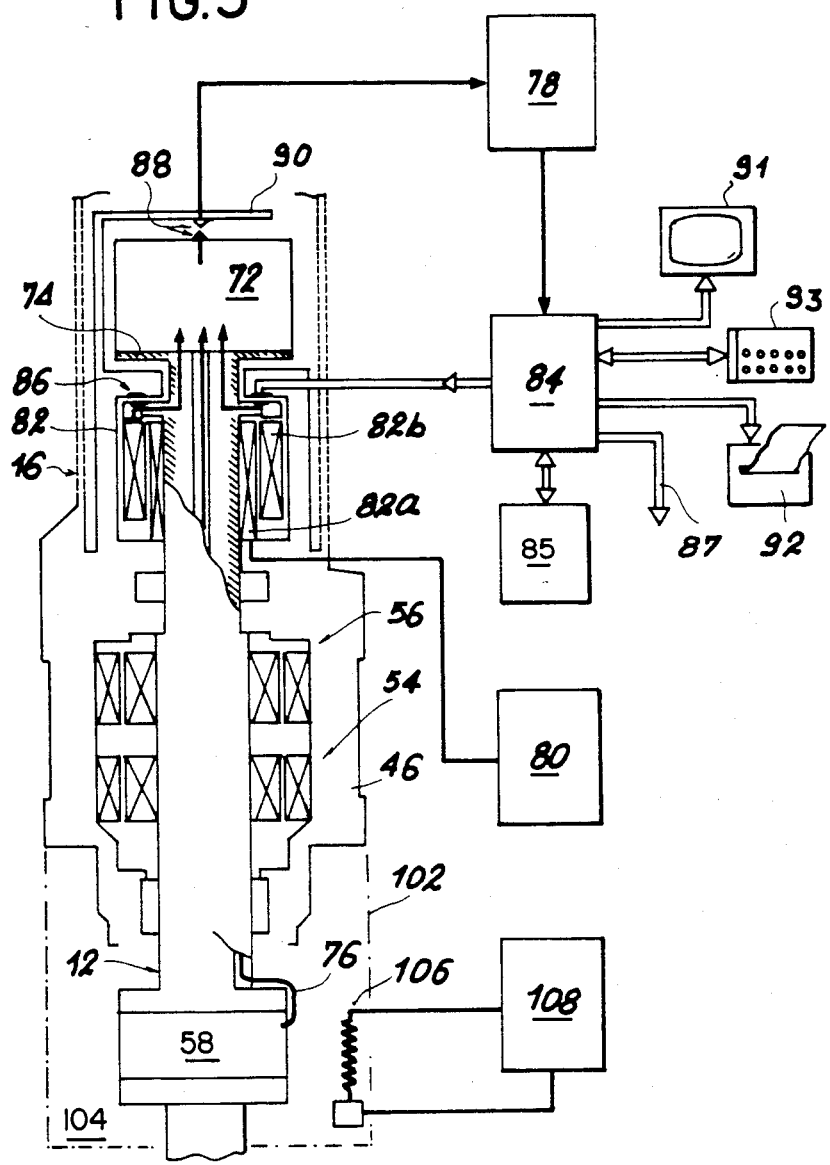
FIG. 3 a view comparable to FIG. 2 and more particularly illustrating the transmission of signals between the pulling pin and the circuits for processing said signals, these circuits being connected to a checking or control computer.

In order to solve the problem of the transmission of electrical signals supplied by the weight transducer 58 up to the non-rotary parts of the machine, it can be seen by referring to FIG. 3 that said machine utilizes different transmission procedures as a function of the nature of the signal, said procedures having the common feature of eliminating any rotary electrical contact between the pin and the part 46 of the carriage 16.

Firstly and in order to reduce to the greatest possible extent the length of electrical wires before the signal supplied by transducer 58 are subject to a first processing, which makes it possible to prevent the formation of interference, which could be prejudicial to the measurement, a first electronic circuit or preliminary processing circuit 72 is placed directly on a plate 74 mounted at the upper end of pulling pin 12 above part 46 of the carriage. Wires 76 carry to circuits 72 the electrical signal supplied by transducer 58 passing through appropriate passages formed in the upper part 12a of the pulling pin, as shown in FIGS. 2 and 3.

The main function of processing circuits 72 are to amplify the signal from the weight transducer, multiplex this amplified signal, together with auxiliary analog quantities such as temperature measurements, then convert all these quantities into a pulse train in a voltage—frequency converter, e.g. at 1 MHz.

Bearing in mind these different functions of processing circuit 72, it can be seen that three types of quantity must circulate between circuit 72, power supply 80 and a checking computer 84 connected to a memory 85. This computer is also connected to a display means 91, a printer 92 and a data input keyboard 93.

The three types of quantity are:

the supply voltage supplied by the power supply 80, which supplies the primary 82a of the rotary transformer, whose secondary 82b supplies circuit 72;

the multiplexing instructions of the quantities conditioned in circuit 72, as well as checking instructions to be defined hereinafter are supplied by computer 84, whilst other outputs 87 of the computer supply checking signals applied to the input 7 of heating means 8 of furnace 9 and to inputs 4 of the translation control means 5 for crucible 14 and the rotation—translation of the pulling pin;

information supplied by circuit 72 and which must be transferred to the main processing circuit 78 located in the console.

Firstly, and as illustrated by FIG. 3, the supply voltage of circuit 72 supplied by power supply 80 is transmitted from part 46 of carriage 16 to circuit 72 which is rotated with pin 12 by a rotarty transformer 82, whose primary 82a is connected to part 46 and is placed within the secondary 82b, which is fixed to pin 12.

In addition, checking instructions supplied by computer 84 are transmitted to circuit 72 between part 46 and pin 12 via a capacitive coupling system 86, e.g. on a 3 MHz carrier.

Finally, the information supplied in the form of a pulse train by processing circuit 72 is transmitted to the main processing circuit 78 by an electrooptical system constituted by two photodiodes 88 positioned along the axis of pin 12 and arranged in facing manner, whilst being respectively joined to circuit 72 and a plate 90 fixed to the carriage part 46.

In order to permit the interchangeability of that part of pin 12 which carries the nucleus, FIG. 2 shows that the lower part 12b of the pin is mounted by a dismantlable device 92 on an intermediate part 12c, which is itself connected to the upper part 12a via weight transducer 58.

More specifically, the dismantlable device 92 is constituted by a pin 94, which simultaneously enters the e.g. square holes 96, 98 respectively formed in the complementary ends of pulling pin parts 12b, 12c. Pin 94 is kept in position in the holes by a spring 100. This device has the advantage of permitting very easy dismantling of lower part 12b by exerting a slight upward pressure counter to spring 100, so as to so disengage pin 94 from holes 96 and 98. Moreover, said device ensures a perfect centering without a longitudinal clearance and which is not rotary.

FIG. 4 diagrammatically shows a monocrystal, such as that which can be obtained by using the Czochralski pulling method with the aid of a machine as described hereinbefore and through utilizing the process of the invention, which will be described in greater detail hereinafter. Important geometrical parameters and other physical parameters correspond to said monocrystal. The geometrical parameters are shown in FIG. 4 and are as follows:

$\phi_1$: nucleus diameter $\phi_2$: monocrystal ingot diameter $H_1$: nucleus length $H_2$: monocrystal ingot heat length $\theta$: angle of the conical part of the monocrystal ingot head $R_1/R_2$: ratio of the radii respectively corresponding to the connections of the nucleus to the ingot head and of the ingot head to the cylindrical part of the ingot $H_t$: total height of the ingot corresponding to the sum of the lengths of the nucleus, the ingot head and the ingot body.

The other physical parameters used in the definition of the monocrystal which it is desired to obtain with the aid of the aforementioned machine and by the process according to the invention are the density of the liquid of the molten products used for pulling the monocrystal, the density of the solid monocrystal and the total weight of the monocrystal. Finally, other important parameters are the linear crysallization speed $v_s$, the ratio $PC = v_c/v_h$ ($v_c$ designating the rise speed of the crucible and $v_h$ the fall speed of the liquid in the crucible), the pulling time, the duration of the formation of the head of the monocrystal (located between the nucleus and the cylindrical part of the monocrystal).

These different parameters are recorded in memory 85 of computer 84 and will be used for defining in the inventive process, on the one hand the monocrystal pulling speed and on the other hand the control and the regulation of the furnace by measuring the successive weights of the monocrystal ingot during pulling.

FIG. 5 provides a better understanding of the way in which the translation speeds of the pin and crucible are calculated, as a function of the level of the bath of molten products in the crucible, knowing that this level must be located in a constant temperature gradient to ensure that monocrystal pulling takes place under good conditions, and particularly that the geometrical parameters defining the shape of the monocrystal are respected. $N_1$ is the level of the molten product in crucible 14 at time t and $N_2$ the level of these products at a time $t+dt$ during pulling. During the time interval dt, a mass $d_n$ occupying a volume $dv_s$ (shown in hatched form in the drawing) of products crystallizes.

The volume $dv_s$ of solids crystallized during time dt can be expressed by the formula:

$$dv_s \pi \times (d^2/4) \times ds.$$

(d being the pulling diameter).

In this formula, ds represents the height of the monocrystal formed during the time interval dt above the molten bath level. During this time interval, the level of molten products in the crucible has passed from level $N_1$ to level $N_2$. The difference between these levels is designated dh in the drawing.

In the same way as the volume $dv_s$ of the products crystallized during a time interval dt has been expressed, it is possible to express the volume $dv_h$ of molten products having disappeared from the crucible by the relation:

$$dv_h = \pi \times (D^2/4) \times dh$$

(D being the internal diameter of the crucible).

Thus, the mass of solid crystal formed corresponds to the mass of molten products which as disappeared from the crucible, so that it is possible to write:

$$ds \times \pi \times (d^2/4) \times \rho s = \rho l \times \pi \times (D^2/4) \times dh.$$

In this relation, $\rho s$ and $\rho l$ respectively designate the densities of the monocrystalline solid formed and molten products in the crucible.

On respectively designating by $v_h$ and $v_s$ the speeds of the drop of the molten product in the crucible and the crystallization of said products during pulling, it is possible to write:

$$v_h = (dh)/(dt) \text{ and } v_s = (ds)/(dt).$$

The ratio of the speeds is consequently equal to:

$$\frac{v_h}{v_s} = \frac{\rho s}{\rho l} \times \frac{d^2}{D^2} = \frac{\frac{dh}{dt}}{\frac{ds}{dt}} = RA.$$

The pulling speed (which can also be called head translation speed) can be expressed by the relation:
$$v_t = v_s - v_h + v_c.$$

This pulling speed can also be expressed as a function of the ratios RA and PC defined hereinbefore defined in the following way:

$$v_t = v_s - v_h + v_c = v_s(1 - RA + PC \times RA).$$

In the same way, the crucible translation speed is $v_c = PC \times v_h = PC \times RA \times v_s$.

A certain number of supplementary parameters making it possible to perform the process according to the invention will now be defined. The first parameter is the sampling period PE, which is predetermined and corresponds to the time interval $\Delta t$ separating the weight measurements performed with the aid of the transducer by the measuring chain or cascade. Each of these measurements is represented by signals, which are applied to the electronic processing circuit 78 (FIG. 3). A further parameter is the time interval TC, during which the computer performs an integration of the monocrystal weight signal. Thus, the weight signal from the transducer is, following conditioning by the processing circuit, converted into a pulse train. These pulses are accumulated in a counting scale of the computer and which represents a programmable integration time TC. Reading the content of this counter is significant of the weight and is performed by the computer with the timing of the sampling interval PE.

The successive weight values obtained in this way are subject to fluctuations caused by mechanical vibrations of the machine. Thus, this leads to fluctuations with respect to the extraction of the weight derivatives used as the relevant quantities for regulating the growth process. As will be shown hereinafter, a sliding mean filtering process is used for reducing the influence of these fluctuations. The parameters making it possible to adjust this filtering are the number M of sampling intervals representing the time difference on which the weight derivative is taken and the number N of weight derivatives stored in the memory used at each instant for extracting the filtered weight derivative by averaging.

Finally, the following complementary parameters are used for performing the process:
the limit value for the furnace control voltage (this voltage is regulated under the control of the computer), as will be shown hereinafter,
the duration of furnace cooling (at the end of monocrystal pulling),
the pin rotation during pulling,
the pin rotation speed: $v = f(t)$,
the proportional regulation constat P(t),
the integral regulation constant I(t).

These regulation constants will be defined hereinafter.

The pin rotation speed and the proportional and integral regulation constants are important parameters in checking crystalline growth. Thus, the thermal conditions change considerably as a result of the disappearance of molten products from the crucible, accompanied by the appearance of solid crystallized products. In order to follow these changes, these parameters vary as a function of time, as will be shown in greater detail hereinafter.

Clipping of the filtered weight derivative is carried out prior to introduction into the proportional term and this clipping is defined by a threshold parameter EP. Another filtered weight derivative clipping is carried out before introduction into the integral term and this clipping is defined by a threshold parameter EI.

These clipping operations are carried out because it is necessary to ensure that aberrant measurements without significance, do not enter the proportional and integral terms. These operations are performed under conditions, which will now be described in greater detail.

In a manner known from the theory of servomechanisms, if PE or $\Delta t$ designates the sampling interval, P(t) the proportional constant and I(t) the integral constant of the control loop, it is possible to calculte at each instant t, the action to be applied to the heating member, as a function of the variation between the weight derivative and its reference.

The variation $Q_2(t)$ of the weight derivative compared with its reference $V_1(t)$ can then be expressed by the relation:

$$Q_2(t) = V_1(t) - Q_1(t)$$

In this relation, $Q_1(t)$ designates the weight derivative measured after filtering.

FIG. 6 provides a better understanding of the clipping of the proportional and integral actions.

With regards to the clipping of the integral term, this is carried out as a function of the following considerations:

If $|Q_2(t)| > EI$, then the difference $\widetilde{Q}_2(t)$ compared with the reference entering the integral term is expressed by the relation: $\widetilde{Q_2}(t) = EI$ (assigned the sign of $Q_2(t)$) and if $|Q_2(t)|$ does not exceed EI, $\widetilde{Q_2}(t) = Q_2(t)$.

The integral $Q_3(t)$ of the variation of the weight derivative at time t is expressed by the assignment relation:

$$Q_3(t) = Q_3(t - PE) + \widetilde{Q_2}(t) * PE/I(t)$$

In the above relation, I(t) represents the integral constant.

The clipping of the proportion term takes place in the following way:

If $|Q_2| > EP$, then the variation compared with the reference for the proportional constant is expressed by the relation: $\overline{Q_2}(t) = EP$ (assigned the sign of $Q_2(t)$) and if $|Q_2|$ does not exceed EP, $\overline{Q_2}(t) = Q_2(t)$.

The proportional and integral action is assigned to the variable $Q_4(t)$. This weighted action is linked with the variation of the weight derivative compared with its reference:

$$Q_4(t) = P(t) * \overline{Q_2}(t) + Q_3(t) \quad (1)$$

In this relation, P(t) represents the proportional constant and $\overline{Q_2}(t)$ represents the variation between the weight derivative and its reference, said variation being clipped by the proportional clipping constant, $Q_3(t)$ being the integral term.

On the basis of relation (1), computer 84 will control the control voltage of the heating means during pulling.

The following conditions will provide a better understanding of the use of the weight measurements during pulling in accordance with the inventive process. P(t) is the quantity representing the weight during time and which is sampled at regular time intervals $\Delta t$ or PE.

The derivative (dp)/(dt) of the function P(t) is calculated by forming the difference between two measurements spaced by $M \times \Delta t$. In order to improve the accuracy of the result, the arithmetic mean is performed on N successive terms:

$$\frac{dP}{dt} \simeq \frac{1}{N} \sum_{k=1}^{N} \frac{P(t + (M + k)\Delta t) - P(t + k\Delta t)}{M \times \Delta t}$$

In this relation, M, N and k are integers.

The calculation of this derivative makes it necessary to known M+N values sampled over a time of $(M+N-1)\Delta t$. For a fixed time $A.\Delta t = (M+N-1)\Delta t$, it is attempted to find the values of parameters M and N in such a way that the value obtained is the most significant possible.

As has been proved in the process of the invention which will be described hereinafter, the weight measurements are all independent of one another and can be likened to normal distribution laws, which are well known in mathematics.

P(t) is the weight measurement at time t, so that P(t) follows the normal distribution law of the mean value P and the standard variation $\theta$, designated $\mathcal{N}(P,\theta)$. At time $t+\Delta t, P(t+\Delta t)$ follows the normal distribution law $\mathcal{N}(P+\Delta P, \theta)$. During the interval $\Delta t$, the average weight has increased by $\Delta P$. $\theta$ is an instrumental constant and can be statistically estimated. The weight difference $\delta(t) = P(t+\Delta t) - P(t)$ follows the normal distribution law $\mathcal{N}(\Delta P, \sqrt{2}.\theta)$ or $\mathcal{N}(\Delta P, \sigma)$, whilst designating by $\sigma$ the value $\sqrt{2}.\theta$. It is useful to point out that if $X_1$ follows the normal distribution law $\mathcal{N}(m_1, \theta_1)$ and $X_2$ the normal distribution law $\mathcal{N}(m_2, \theta_2)$, then $X_1 - X_2$ follows the normal distribution law $\mathcal{N}(m_1 - m_2, \sqrt{\theta_1^2 + \theta_2^2}$.

On now considering M intervals of length $\Delta t$ and calling $D_i$ the difference $P(M+i)\Delta t - P(i\Delta t)$, or more simply $P_{M+i} - P_i = D_i$ (i being an integer), as shown on the following diagram

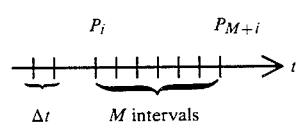

$\Delta t$    M intervals the difference $D_i = P_{M+i} - P_i$ follows the normal distribution law $\mathcal{N}(M.\Delta P, \sigma)$.

We will consider N successive differences $[D_i \ldots D_k \ldots D_{i+N-1}]$, which constitute a group of normal distribution laws $\mathcal{N}(M\Delta P, \sigma)$. On investigating the independence of the terms $D_k$ with respect to these differences, It can be seen that $D_i$ and $D_{i+M}$ for example cannot be independent, because they have a common term: $P_{M+i}$.

$$D_i = P_{M+i} - P_i$$

$$D_{i+M} = P_{2M+i} - P_{M+i}$$

If $N \leq M$, the random variables $[D_i \ldots D_{i+N-1}]$ are indeed independent, because the differences only involve different weights. On writing the mean of $D_k$ for $k = i \ldots i+N-1$:

$$\overline{D} = \sum_{k=1}^{i+N-1} \frac{D_k}{N}.$$

On the basis of the statistically known limiting central theorum, this quantity follows the normal distribution law  (M∆P, σ/√N), and $$\frac{dP}{dt} = \frac{\overline{D}}{M \cdot \Delta t}$$

follows the normal distribution law $$\left( \frac{\Delta P}{\Delta t}, \frac{\sigma}{\sqrt{N}, M \cdot \Delta t} \right)$$

If N>M, the independence from random variables is no longer true. On forming the sum of the values $D_k$, certain terms are simplified, e.g. $D_i + D_{M+i} = P_{M+i} - P_i + P_{2M+i} - P_{2M+i} = P_{2M+i} - P_i$. There is a weight difference on an interval $2M \times \Delta t$. A simple example will provide a better understanding of the principle of independent variables.

For example, M=4 and N=10 are chosen so that, with the aforementioned notations, we obtain $D_i = P_{i+4} - P_i$ for I=1 ... 10. When the sum of $D_i$ is written by groups of four terms, we have the following:

$$(P_5 - P_1) + (P_6 - P_2) + (P_7 - P_3) + (P_8 - P_4)$$

$$(P_9 - P_5) + (P_{10} - P_6) + (P_{11} - P_7) + (P_{12} - P_8)$$

$$(P_{13} - P_9) + (P_{14} - P_{10}).$$

On calling $D_k$ the sum of the column of the above table, for k=1 ... 4, we then have:

$$\widetilde{D}_1 = P_{13} - P_1, \widetilde{D}_2 = P_{14} - P_2, \widetilde{D}_3 = P_{11} - P_3,$$
$$\widetilde{D}_4 = P_{12} - P_4.$$

These four random variables are now certainly independent and $\widetilde{D}_1$ follows the normal distribution law $\mathcal{N}(12\Delta P, \sigma)$, $\widetilde{D}_2$ the normal distribution law $\mathcal{N}(12\Delta P, \sigma)$, $D_3$ the normal distribution law $\mathcal{N}(8\Delta P, \sigma)$, $D_4$ the normal distribution law $\mathcal{N}(8\Delta P, \sigma)$ for four variables, so that we have:

$$\overline{D} = \sum_1^4 \frac{\widetilde{D}_k}{4} = \sum_1^2 \frac{\widetilde{D}_k}{4} + \sum_3^4 \frac{\widetilde{D}_k}{4}.$$

$\frac{1}{4}(D_1 + D_2)$ following the normal distribution law $$\left( 6\Delta P, \frac{\sigma \sqrt{2}}{4} \right),$$

$\frac{1}{4}(\widetilde{D}_3 + \widetilde{D}_4)$ the normal distribution law $$\mathcal{N}\left( 4\Delta P, \frac{\sigma \sqrt{2}}{4} \right).$$

Thus, $\overline{D}$ follows the normal distribution law $\mathcal{N}(10\Delta P, \sigma/2)$ and in general terms the normal distribution law $$\mathcal{N}\left( N \cdot \Delta P, \frac{\sigma}{\sqrt{M}} \right).$$

We then obtain $(dP)/(dt) = (D\sigma)/(N.\Delta t)$ which follows the normal distribution law $$\left( \frac{P}{\Delta t}, \frac{\sigma}{\sqrt{M}, N \cdot \Delta t} \right).$$

In general terms, on designating by a, the quotient and b the remainder of the integral division of N by M, $N = a \times M + b$. On arranging the values $D_k$ in accordance with M columns, we obtain a complete lines, plus one incomplete line of b terms, as is shown by the following table. $\widetilde{D}_k$ is called the sum of the terms contained in the kth column:

$$\begin{cases} \widetilde{D}_k = P_{i+(a+1)M+k-1} - P_{i+k-1} \text{ with } 1 \leq k \leq b - 1 \\ \widetilde{D}_k = P_{i+aM+k} - P_{i+k} \text{ with } b \leq k \leq M \end{cases}$$

The group of random variables $D_k$ is independent.

$$\underbrace{\begin{matrix} D_i & D_{i+b-1} & D_{i+b} & D_{i+M-1} \\ D_{i+M} & D_{i+M+b-1} & D_{i+M+b} & D_{i+2M-1} \\ D_{i+(a-1)M} & D_{i+(a-1)M+b-1} & D_{i+(a-1)M+b} & D_{i+aM-1} \end{matrix}}_{M \text{ columns}} \Bigg\} a \text{ lines}$$

$$\underbrace{D_{i+aM} \quad D_{i+aM+b-1}}_{b \text{ terms}}$$

$$\widetilde{D}_1 = (P_{i+(a+1)M} - P_i), \ldots, \widetilde{D}_b = (P_{i+(a+1)M+b-1} - P_{i+b-1})$$

which follow the normal distribution law $\mathcal{N}((a+1)M\Delta P, \sigma)$, $D_{b+1} = (P_{i+aM+b} - P_{i+b}), \ldots$, $D_M = (P_{i+(a+1)M-1} - P_{i+M-1})$ which follow the normal distribution law $\mathcal{N}(aM\Delta P, \sigma)$ with the mean value $$\overline{D} = \sum_{k=1}^M \frac{\widetilde{D}_k}{M} = \sum_1^b \frac{\widetilde{D}_k}{M} + \sum_{b+1}^M \frac{\widetilde{D}_k}{M} \sum_1^b \frac{\widetilde{D}_k}{M}$$

which follow the normal distribution law $$\mathcal{N}\left( b(a+1)\Delta P, \sigma \sqrt{\frac{b}{M}} \right) \sum_{b+1}^M \frac{\widetilde{D}_k}{M}$$

which follow the normal distribution law $$\mathcal{N}\left( a(M-b)\Delta P, \sigma \sqrt{\frac{M-b}{M}} \right)$$

However $b(a+1)\Delta P + a(M-b)\Delta P = (aM+b)\Delta P = N\Delta P$

Therefore, $\overline{D}$ follows the normal distribution law $$\mathcal{N}\left( N\Delta P, \frac{\sigma}{\sqrt{M}} \right)$$

for N>M.

This formula is to be compared with the case $N \leq M$ and it is merely necessary to interpose N and M. $N \leq M = (dp)/(dt)$ follows the normal distribution law $$\mathscr{N}\left(\frac{\Delta P}{\Delta t}, \frac{\sigma}{\sqrt{N \cdot M \Delta t}}\right)$$

N>M; (dP)/(dt) follows the normal distribution law $$\mathscr{N}\left(\frac{\Delta P}{\Delta t}, \frac{\sigma}{M \cdot N \cdot \Delta t}\right)$$

The optimum values of M and N will now be sought in order to obtain the best signal-to-noise ratio.

We set $A = M + N - 1$, which represents the number of intervals $\Delta t$ used at each instant in the calculation of the derivative and the sliding mean of said derivative.

For N>M, we will calculate the value S of the relationship of the mean value of the normal distribution law with the standard variation defined hereinbefore:

$$S = \frac{N \cdot \Delta P \sqrt{M}}{\sigma} = \frac{(A + 1 - M) \sqrt{M}}{\sigma} \cdot \Delta P$$

Figures 7, 8:
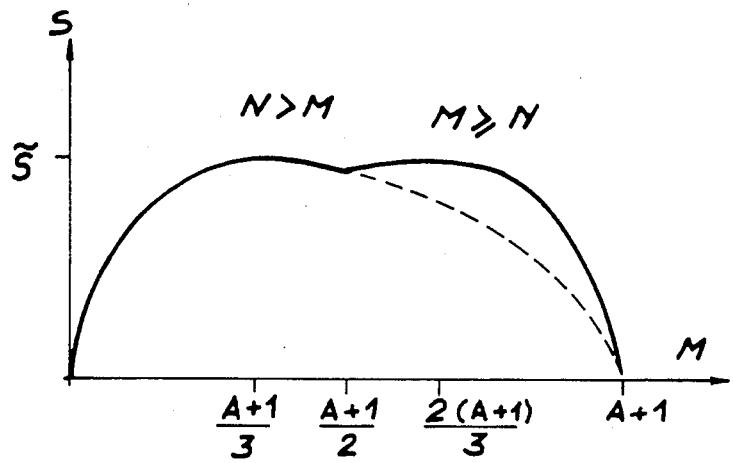
FIG. 7 a graph showing the variation of the signal-to-noise ratio for the weight derivative information following digital processing used in the process according to the invention.
FIG. 8 two tables I and II of the results of FIG. 7 useful in the process according to the invention.

This function is shown in FIG. 7.
Its derivative $$\frac{dS}{dM} = \frac{\Delta P}{2\sigma}\left(\frac{A + 1 - 3M}{\sqrt{M}}\right)$$

is cancelled out for $M = (A+1)/3$ when N>M. Thus, the sought optimum is reached for $M = (A+1)/3$.

The corresponding value of S for this optimum is:

$$\tilde{S} = \frac{2\Delta P}{\sigma}\left(\frac{A + 1}{3}\right) 3/2$$

For N≦M, $$S = \frac{M \Delta P \sqrt{N}}{\sigma},$$

the optimum is reached for $$M = 2N = \frac{2(A + 1)}{3}$$

and $$\tilde{S} = \frac{2\Delta P}{\sigma}\left(\frac{A + 1}{3}\right) 3/2$$

In conclusion, for a given number A, it is necessary to take N and M in a ratio 2, in order to realise the optimum conditions.

Tables 1 and 2 of FIG. 8 respectively give for $A + 1 = 12$ and $A + 1 = 24$, the corresponding values of N, M and $(\sigma \cdot S)/(\Delta P)$. These tables shown that for $A + 1 = 12$, the optimum values of N and M are respectively 8 and 4 and for $A + 1 = 24$ the optimum values of N and M are respectively 8 and 16.

The influence of the sampling rate on these results will now be investigated. We set $(\Delta P)/(\Delta t) = C$ (constant) in order to make the sampling period $\Delta t$ appear in the expression $\tilde{S}$:

$$\tilde{S} = 2\frac{C}{\sigma} \cdot \Delta t \left(\frac{A + 1}{3}\right) 3/2$$

Hereinafter, it will be considered that $A \gg 1$ and in practice A is approximately 30 to 40.

For example, it will be assumed that the sampling period is reduced in the ratio n, the new sampling period is then so written $\hat{\Delta t} = (\Delta t)/n$. Knowing that it is necessary to retain the same time difference for the calculation of the successive differences, it is necessary to multiply by n the value of M and $$M \times \Delta t = \hat{M} \cdot \hat{\Delta t} \text{ and } \hat{M} = nM$$

With a view to obtaining an easy comparison of the measurements, it is also necessary to retain the same duration on all the measurements and:

$$\hat{A} \times \hat{\Delta t} = A \times \Delta t \text{ and } \hat{A} = nA$$

However, we still have $\hat{A} + 1 = M + N$ or $\hat{A} + 1 = \hat{M} + \hat{N}$, so that $\hat{N} = nA + 1 - nM = n(N-1) + 1$.

Comparing $\tilde{S}$ and $\hat{S}$ (for $\hat{\Delta t} = (\Delta t)/n$):

$$\tilde{S} = \frac{2C}{\sigma} \Delta t \left(\frac{A + 1}{3}\right) 3/2 \ \# \ \frac{2C}{\sigma} \Delta t \left(\frac{A}{3}\right) 3/2$$

$$\hat{S} = \frac{2C}{\sigma} \frac{\Delta t}{n} \left(\frac{nA + 1}{3}\right) 3/2 \ \# \ \frac{2C}{\sigma} \frac{\Delta t}{n} \left(\frac{nA}{3}\right) 3/2$$

so that $\hat{S} \simeq > n \cdot \tilde{S}$.

It can be deduced therefrom that the increase in the sampling rate makes it possible to further improve the signal-to-noise ratio.

The process according to the invention consists of making optimum use of the information from the weight signal for controlling the pulling machine.

Temperature regulation takes place on the basis of the weight derivative and by varying the voltage applied to the heating means in accordance with the explanations given hereinbefore.

On the one hand, the weight information must be retainable during a space of time (variable M defined hereinbefore) in order to obtain a good weight derivative approximation from the weight differences at the extreme times separated by the time interval M$\Delta$t. In this way, the weight variation due to the growth of the monocrystal preponderates with respect to the noise.

On the other hand, in order to still further improve the weight derivative quality and as indicated hereinbefore, it is of interest to take the arithmetic mean of the last N weight differences.

These considerations lead to the formation of two piles or stacks containing the weights and the weight differences. These stacks are formed in memory 85 of computer 84. The first stack containing the weight is a linear stack of the FIFO type (first in first out), used for calculating the weight differences. The second stack is a circular stack containing the hereinbefore calculated weight differences. It is used in the invention for calculating the sliding mean of the N weight differences. These stacks are not shown in detail, because their principle is known in the art. In the first stack all the elements of the stack slide by one row, by eliminating the oldest value still at the bottom and then the new weight value arrives at the top of the stack. For each weight value, all the elements of the stack are displaced upwards by one row. When the processing of this stack is at an end, the difference $P(t) = P(M) - P(O)$ is calculated, representing the differences of the weights on the interval $M\Delta t$. It is then transferred into the second circular stack, in which a variable S permanently contains the sum of the N last differences. Only a single stack element, indicated by a variable access pointer, changes during each manipulation, the oldest value is replaced by the new one.

In this way, the speed of performing the algorithms is optimized, so that it is possible to directly lower the lower limit of the useful sampling rate. It follows that the information rate increases and that there is a precision gain in the derivative measurement. In other words, for the same interval, the mean value will relate to a larger number of terms and consequently the error will decrease. The (filtered) averaged weight derivative obtained from the circular stack is, as shown hereinbefore, compared by the computer with the reference weight derivative. The variation is used jointly with the geometrical data for checking the heating means and the rotation—translation control means of the pin-holding head.

Figure 9:
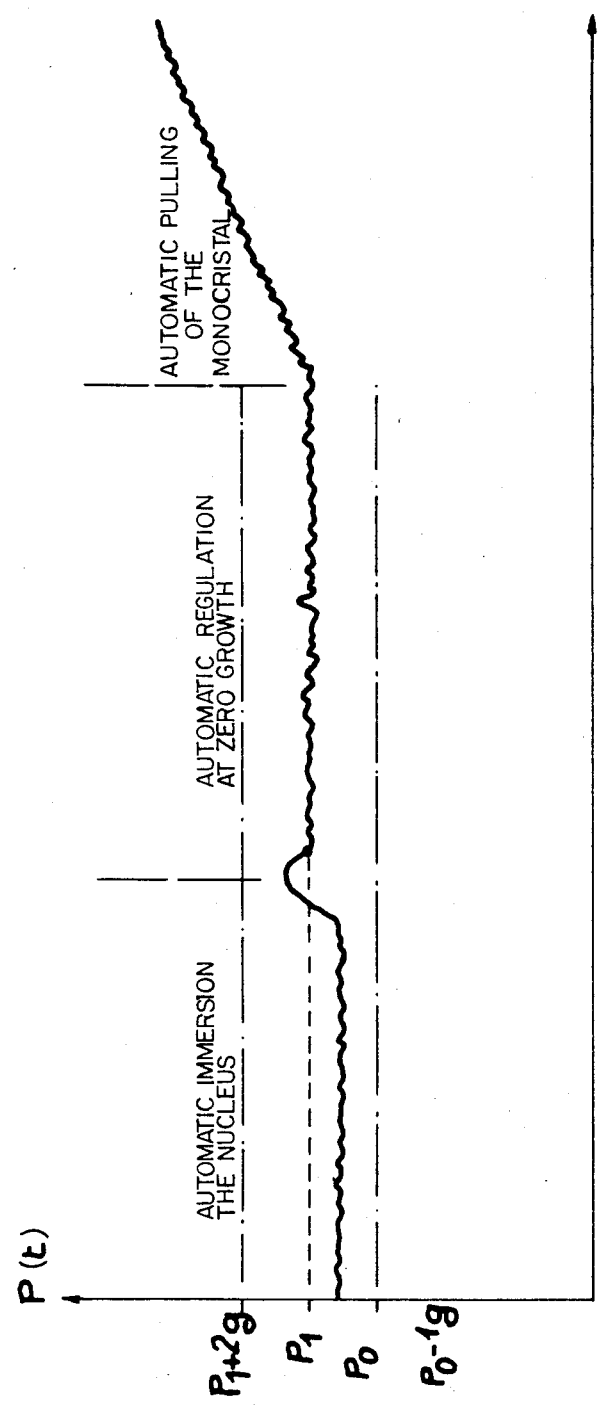
FIG. 9 the weight variations detected by the transducer during the automatic immersion, regulation and pulling operations of the process according to the invention.

FIG. 9 will give a better understanding of the process of the invention. It is a diagram showing the weight variations P(t), as a function of the time t and showing the successive essential operations of the process according to the invention.

According to this process, the machine is firstly controlled in order to carry out an automatic immersion of the nucleus in the molten product bath, and then, said immersion being carried out under the conditions to be described hereinafter, the temperature of the heating means is automatically regulated for a zero growth of the monocrystal (rotation of the pin, but no rotation thereof). Finally, at the end of this automatic regulation, the process makes it possible to check the automatic pulling of the monocrystal, on the basis of the aforementioned principles and calculations.

The automatic nucleus immersion operation consists of rapidly and then more slowly moving the nucleus-carrying pin up to the surface of the molten products. During this operation, the computer connected to the transducer checks whether the weight $P_O$ of the pin and nucleus remains constant. When the nucleus touches the surface of the molten products, the weight of the pin and the nucleus is subject to a sudden rise, represented by a singularity, such as a pulse A in the drawing. Thus, following this sudden weight increase, due to the viscosity forces exerted on the nucleus, the weight of the pin and the nucleus drops slightly to reach a value $P_1$ exceeding value $P_O$.

It is obviously assumed that the molten product bath has been raised by the high frequency-type heating means to the melting temperature. For example, in the case of a gadolinium and gallium garnet, this temperature is 1750° C. The operation making it possible to bring the bath to the melting temperature lasts approximately 12 hours, This time and also the melting temperature can be directly regulated by the operator.

In the automatic nucleus immersion operation the nucleus can be rapidly moved towards the bath surface by lowering the pin and the nucleus by 1 cm every minute then as from a certain level of the nucleus above the bath surface by continuing this approach at a rate of e.g. 0.75 mm/5 seconds. Between each pin translation step, a weight measurement is performed and the result obtained is compared with the result of the original weight. This makes it possible to detect any incident in the nucleus approach phase. If, following a predetermined travel, the contact between the nucleus and the surface of the bath is not detected, a call to the operator can be automatically initiated.

If the singularity or pulse A exceeds a predetermined threshold, which can easily be fixed by $p_1 + 2$ g, the weight signal supplied by the transducer then has an amplitude greater than that due to the viscosity forces alone. It is deduced therefrom that there is an incident (e.g. too low bath temperature) and that the pin must be raised in order to recommence the nucleus immersion sequence.

When the automatic immersion has been correctly performed and the weight indicated by the transducer remains within the accepted limits, the process according to the invention then consists of controlling, by means of the computer, the automatic regulation of the power of the heating means, in order to stabilize the crystallization starting conditions. Thus, a zero growth equilibrium point is reached at the solid—liquid interface. This operation is performed by means of a proportional and integral regulation algorithm (whose principle has been defined hereinbefore), the weight reference here being a zero weight derivative. During this automatic regulation operation, the computer records amplitude fluctuations of the weight signals supplied by the transducer and following a predetermined period (e.g. 30 minutes) the process of the invention then consists of controlling the automatic pulling of the monocrystal, provided that during the zero growth automatic regulation, the variations of the weight derivative have remained within the admissible limits, which are e.g. here defined by $P_1 \pm 1$ g.

As will be shown hereinafter, it is obvious that at all times the operator can manually resume the process in order to shorten the automatic regulation operation, or for modifying the initial conditions, or e.g. in the case of an incident.

Abnormal configurations can appear when the initial thermal conditions are not satisfactorily fixed and the computer is unable to automatically correct them. For example, this is the case when the temperature of the molten bath is too low for an anarchic growth of the monocrystal to be detected. This also applies when the temperature of the molten bath is too high and the nucleus, at the time of immersion, loses too much weight. The computer can then react to control a reduction in the power supplied by the heating means. In this case, the nucleus is returned to the initial automatic immersion position and the immersion sequence is resumed.

The following operation relates to the automatic pulling or growth of the monocrystal where use is made of the results concerning the weight derivatives calculated hereinbefore. The monocrystal growth speed fluctuations, following digital filtering of the weight derivatives, are compared with the reference. The variations weighted by the proportional and integral actions (clippable actions) are supplied to the analog output of the computer for checking the power of the heating means. During pulling, the regulation constants and the crystal rotation speed follow a precise algorithm, more particularly defined by the parameters introduced on initialization into the computer memory. In order to retain a constant crystallization speed and a clearly defined position of the solid—liquid interface, the translation speeds of the pin and the crucible are calculated at all times as a function of the weight derivative reference. It should be noted that at all times the operator can manually adjust the regulation constants. In the case of an emergency, he can also always stop growth.

Finally, the last operation, not shown in the diagram of FIG. 9, consists of checking the cooling of the heating means. The computer automatically controls the separation of crystal and bath then the slow stopping of the pin rotation and then the lowering of the heating power (approximately 15 hours).

Figure 10:
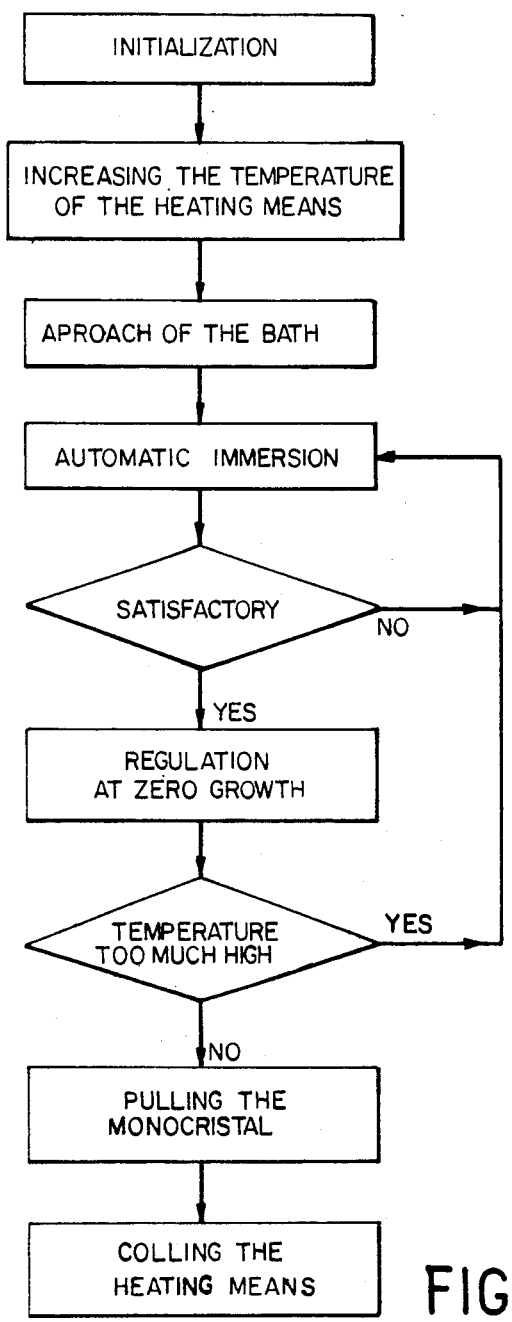
FIG. 10 a general flow chart of the process according to the invention.

FIG. 10 is a general flow chart of the process according to the invention. The process performance starts by an initialization operation during which the aforementioned parameters are introduced into the computer memory. These are in particular parameters relating to the shape of the monocrystal to be obtained, the translation and rotation speeds, the temperature of the heating means, etc.

The second operation consists of fixing the temperature of the heating means, as a function of the products contained in the crucible.

The following operation relates to the automatic approach of the bath of molten products, which is firstly a fast approach and then a much slower approach, as indicated hereinbefore.

The following operation relates to the automatic immersion of the end of the nucleus in the molten product bath and this automatic immersion will be described hereinafter with the aid of more detailed flow chart.

The automatic immersion is checked by testing in order to establish, as a function of the weight measurement supplied by the transducer, whether or not said immersion is satisfactory. If the automatic immersion proves to be unsatisfactory (answer NO to the question "satisfactory immersion"), the pulling pin is raised and a further immersion must be performed. However, if the automatic immersion is satisfactory (answer YES to the above question), the following operation consists of regulating the temperature of the heating means with zero monocrystal growth. This zero growth regulation operation is described hereinafter relative to a more detailed flow chart. In the zero growth, the pin effects a rotary movement and no translatory movement is applied thereto. This operation makes it possible to ensure the satisfactory crystallization of the products at the end of the nucleus.

The following operation consists of checking whether the temperature of the heating means is between acceptable upper and lower limits. If this temperature is too high, the nucleus at the end of the pin melts on the molten product bath surface and pulling is impossible. It is then necessary to raise the pin and the nucleus to perform a new automatic immersion thereof, after lowering the temperature. However, if the temperature is too low, it is necessary to act on the heating means for the purpose of increasing this temperature. Monocrystal pulling can start between these two limits. Monocrystal pulling will be described hereinafter relative to a more detailed flow chart. The final operation consists of progressively cooling the heating means, at the end of pulling, in order to extract the monocrystal.

Figure 11:
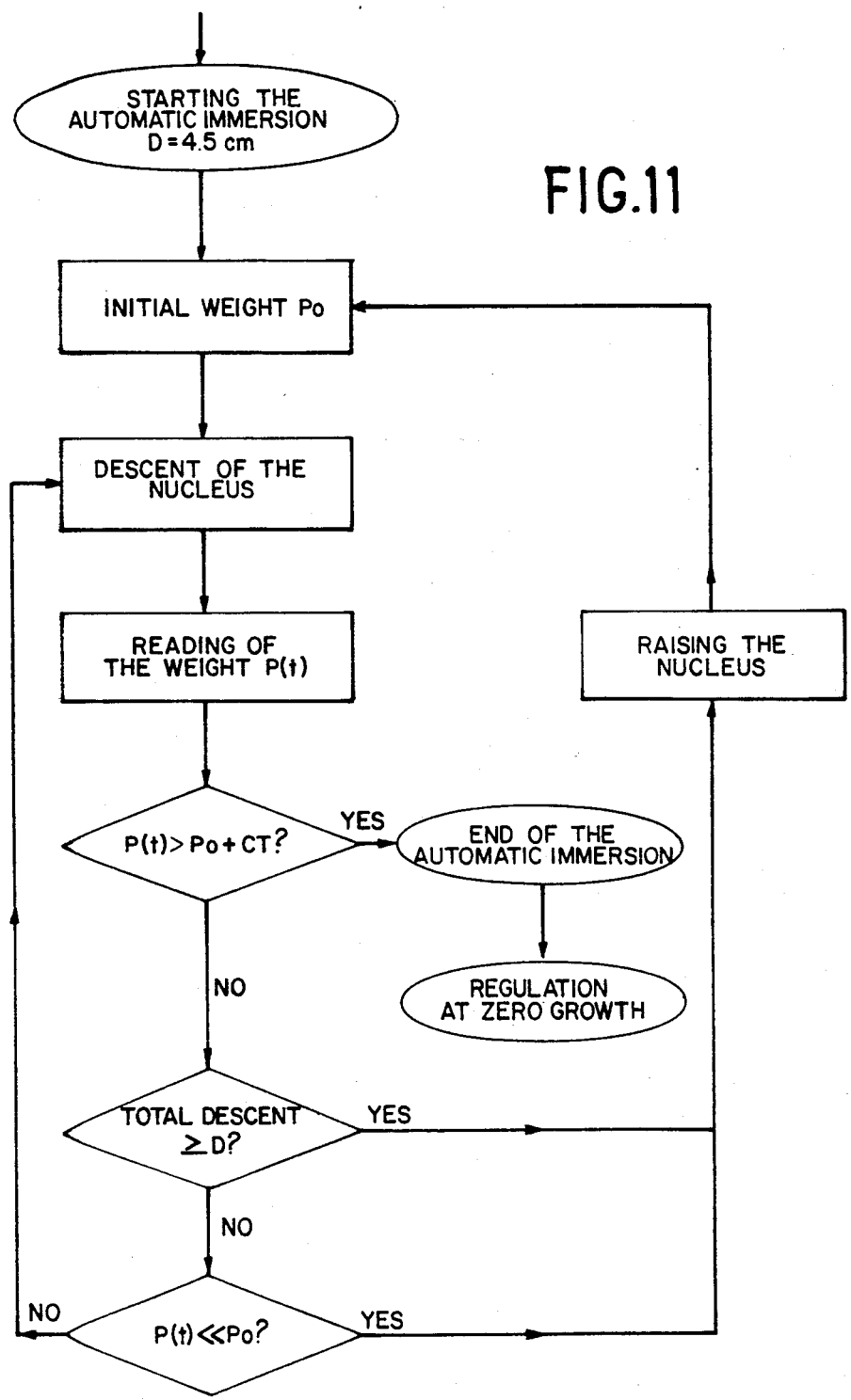
FIG. 11 a flow chart relating to the automatic immersion of the nucleus according to the inventive process.

FIG. 11 is a flow chart permitting a better understanding of the automatic immersion operation of the nucleus. This operation commences when the nucleus at the end of the pulling pin is e.g. positioned at a distance $d=4.5$ cm from the surface of the molten products in the crucible. The weight $P_0$ of the pulling pin carrying the nucleus is measured by the transducer.

The pin and the nucleus then approach the molten bath surface in the manner described hereinbefore. During this approach, the weight $P(t)$ of the pin and the nucleus is constantly measured. In principle, during this descent towards the surface of the molten product bath, weight $P(t)$ must be substantially the same as the initial weight $P_0$. When the nucleus comes into contact with the bath surface, as indicated hereinbefore, the surface tension forces exerted by the molten products on the nucleus lead to an increase in the weight measured by the transducer. If the weight $P(t)$ measured by the transducer exceeds the initial weight $P_0$ augmented by a weight CT defining an effective immersion criterion, automatic immersion has been successful (answer YES to the question $P(t) > P_0 + CT$). This weight increase at the time of nucleus contact is represented by pulse A in FIG. 9. Then the end of the automatic immersion of the nucleus and the start of the zero growth regulation, which will be described hereinafter relative to a detailed flow chart.

However, if the answer to the question $P(t) > P_0 + CT$ is NO, the approach phase of the nucleus with the surface of the bath of molten products continues, and permanent checking takes place to establish whether the total descent of the nucleus is not equal to or exceeds the distance $D + 1$ cm separating the nucleus and the bath surface at the start of the automatic immersion process. If the total lowering of the nucleus exceeds the distance $D + 1$ cm, e.g. through the nucleus melting on contact with the bath, so that it is necessary to raise it to prevent melting of the pin. For example, the nucleus can be raised by 2 cm and the automatic immersion process is resumed in the manner described hereinbefore, following an initial check on the weight $P_0$ of the nucleus and the pin.

If during successive attempts at automatically immersing the nucleus, weight $P(t)$ undergoes a significant loss compared with the initial weight $P_0$ (answer yes to the question $P(t) << P_0$), it is because the nucleus has lost too much weight and it must be raised urgently. However, if the answer to the question $P(t) << P_0$ is NO, the lowering of the nucleus can continue normally.

It is pointed out that at the time of contact between the nucleus and the surface of the molten product bath, the viscosity forces introduce a temporary rise in the value of the weight of the pin and the nucleus. The signal emitted by the weight transducer is weak and very temporary. The increase in the weight $P(t) - P_0$ must exceed the immersion criterion CT chosen by the operator as a function of the molten products and the diameter of the nucleus. As a safety measure, the stepwise lowering of the nucleus is limited to 5.5 cm, so as to ensure that the member supporting the nucleus is not immersed in the bath and does not melt therein.

Figure 12:
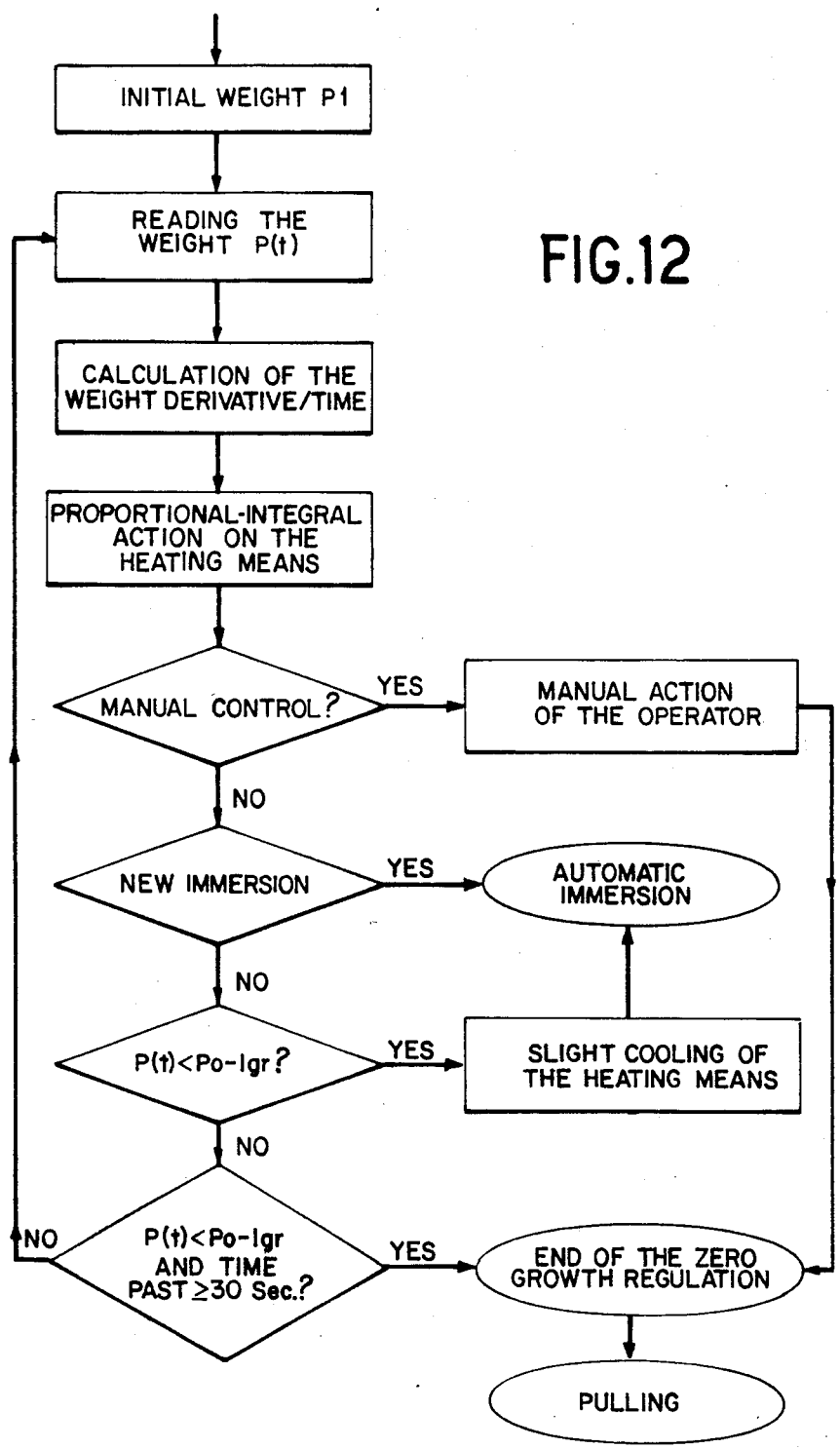
FIG. 12 a flow chart relating to the zero growth regulation according to the process of the invention.

FIG. 12 is a flow chart describing the operation of regulating the temperature of the heating means, with a zero monocrystal growth. This operation starts at the time when the initial weight indicated by the transducer is equal to $P_1$ (cf. FIG. 9), i.e. at the end of pulse A caused by the increase in the weight of the pin and the nucleus, when contact between the nucleus and the molten products is effective.

During this zero growth regulation, the weight of the pin and the nucleus is permanently measured with the sampling period $PE = \Delta t$ referred to hereinbefore.

The computer then supplies variations of the differences of the weight derivatives compared with the reference, as has been stated hereinbefore. The computer then performs a proportional and integral action on the representative function of these variations. The function resulting from this action is used for checking the regulating voltage of the heating means. This regulation makes it possible to keep the weight $P_1$ substantially constant throughout the regulating period. During this proportional and integral action, the operator can perform a manual control (answer YES to the question "manual resumption"), e.g. when he considers that the automatic regulation of the furnace temperature is adequate and he can more rapidly initiate monocrystal pulling or growth.

However, if the operator decides against manual resumption (answer NO to the question) and it is found that the heating means are at an excessive temperature, the computer can control a new automatic immersion (answer YES to the question "new immersion"?).

The computer also permanently checks that the weight P(t) of the pin and the nucleus in contact with the bath is not below a lower predetermined limit which, in the present case, is equal to $P_0 - 1$ g (cf. FIG. 9). If the answer to the question $P(t) < P_0 - 1$ g? is YES, the heating means have an excessive temperature and it is necessary for the computer to control a slight cooling of the heating means.

However, if the answer to the above question is NO, the computer checks whether the weight P(t) indicated by the transducer is equal to or below another upper predetermined limit which, in the present case, is equal to $P_1 + 2$ g (cf. FIG. 9).

If the answer to the question $P(t) \leq P_1 + 2$ g and time past $\geq 30'$ is YES, the end of the zero growth regulation process is ended and monocrystal pulling can start. However, if the answer to the above question is NO, the heating means are for example too cool and it is necessary to again check temperature regulation in the heating means.

Thus, when $P(t) < P_0 - 1$ g, the excessive temperature of the heating means has caused the nucleus to melt. The weight read by the transducer drops. When $P(t) \geq P_1 + 2$ g, the excessively low temperature of the heating means has led to the crystallization of the molten products around the nucleus. If too many products have not been supplied, the automatic regulation of the heating means carried out by the computer can restore the process to the desired state, otherwise manual resumption is necessary.

Figure 13:
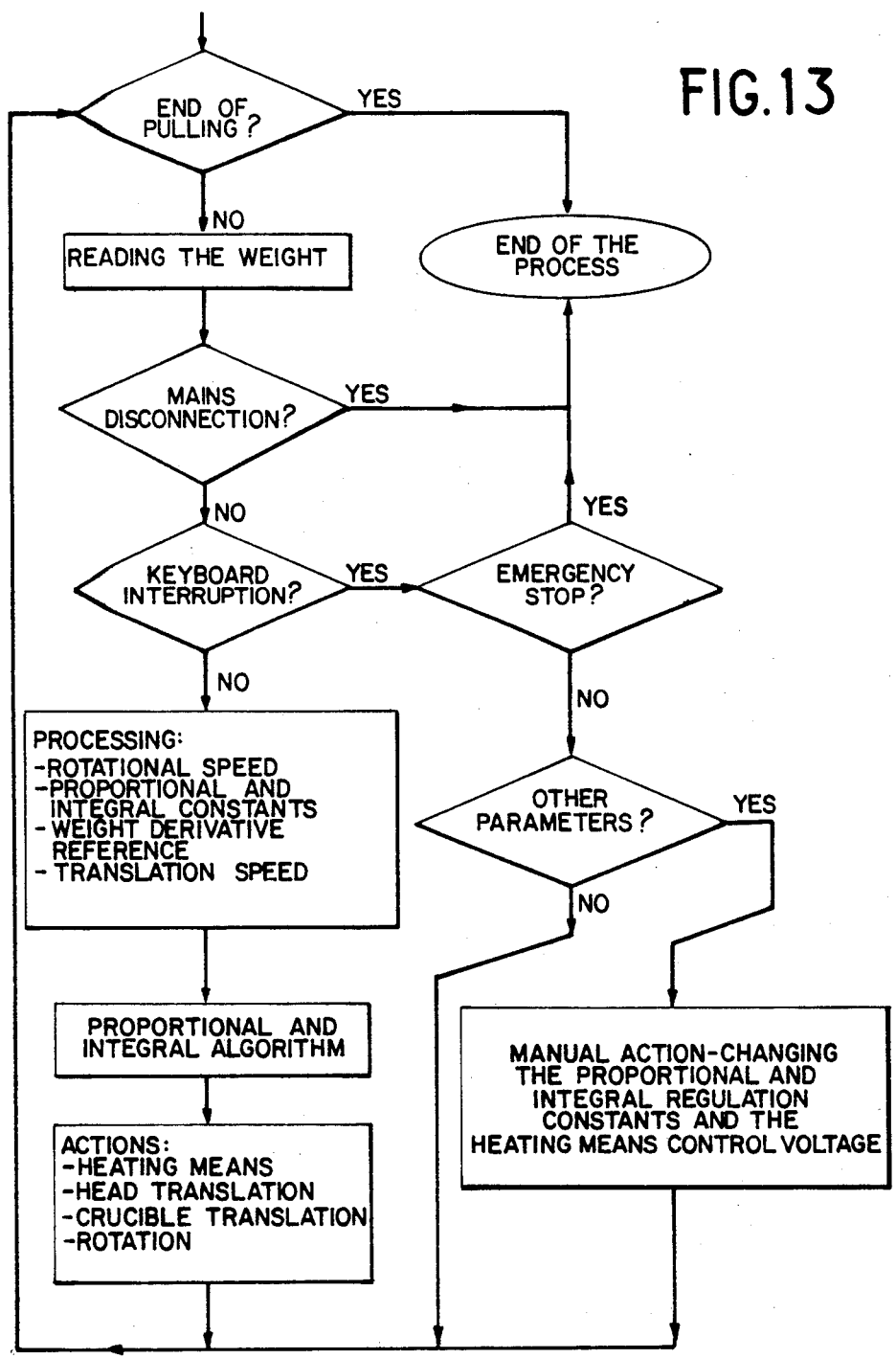
FIG. 13 a flow chart relating to the pulling or growth of the monocrystal according to the process of the invention.

FIG. 13 diagrammatically shows the monocrystal pulling or growth operation, which takes place after the zero growth regulation operation. If pulling is at an end (answer YES to the question "pulling end"?), it is the end of the growth process.

However, if the answer to this question is NO, the computer receives weight measurement information and supplies the control signal necessary for checking the pin rotation speed, calculates the weight derivative values and processes the weight derivative reference. The computer then processes proportional and integral algorithm in such a way as to control the automatic temperature regulation of the heating means during growth. Processing of this algorithm also enables the computer to control the translation of the pin and the crucible, as well as the rotation of the pin.

If, during the pulling process, there is a disconnection of the mains supplying the machine, (answer YES to the question "mains disconnection?"), the computer automatically controls the end of the pulling process.

However, if the answer to the above question is NO, the pulling process can continue in the manner described hereinbefore. The operator can optionally perform an interruption operation by means of the computer data input keyboard (answer YES to the question "keyboard interruption"?). This interruption can either bring about an emergency stop of the machine in order to interrupt the pulling process, e.g. in the case of an incident, or can permit the introduction of other parameters relative to the pulling of the monocrystal into the computer memory.

If the answer to the question "other parameters?" is YES, the operator acts manually, e.g. in order to change the proportional and integral regulation constants, so as to modify the control voltage of the heating means. In the absence of keyboard interruption, the pulling process obviously continues automatically as described hereinbefore.

The process described hereinbefore makes it possible to control the immersion and automatic pulling by significantly improving production. The machines controlled in accordance with the inventive process have reproducible operation even with minimum supervision. For example, these machines can be used during reduced electricity tariff periods, which is very important because these machines consume a large amount of power.

The satisfactory performance of the growth can be checked subsequently by comparing the crystal obtained with the geometrical template used for introducing the data into the computer.

What is claimed is:

1. A process for the control of a monocrystal pulling machine, the machine comprising:
   a crucible containing a bath of a molten product;
   heating means for stabilizing temperature of the product to a temperature above the melting point of the product by heating the crucible;
   temperature regulating means including measuring means for operating said heating means;
   a vertically oriented pulling pin for pulling a monocrystal from the crucible with the aid of a monocrystalline nucleus of the product placed at the lower end of the pin;
   a fixed frame;
   a carriage which moves relative to the frame parallel to an axis of the pulling pin;
   motion means for translating the carriage at at least two different speeds;
   translation means for controlling a translation of the crucible parallel to the pin axis;
   rotation means for rotating the pulling pin about the pin axis, the carriage supporting the pulling pin via said rotation means, the pulling pin comprising a weight transducer supplying signals representing the weight of the pin and the nucleus prior to pulling and evolution of said weight during pulling; and
   an electronic processing circuit including a computer, said weight transducer signals being applied to said computer for checking regulation of the heating means and the carriage motion means and the crucible translation means and the pin rotation means;
   wherein the process comprises;
   recording in a memory of said computer parameters relating to the geometry of the monocrystal and the growth thereof and a program which enables the computer to control the heating means for raising temperature of the crucible for bringing about a melting of the product;

sensing the weight communicated to the computer via said weight transducer signals;

comparing a later value of the weight with a previously stored value of the weight to provide a comparison of the two weights; and activating said motion means in accordance with the comparison of weights to translate the pin along its axis for control of crystal growth; said activating including the steps of:

providing a fast automatic approach of the bath by the pin with the nucleus up to a predetermined distance from the surface of said bath; and providing a slower approach of the bath until the nucleus is in contact with the bath surface; and wherein, following said contact, said process continues with the steps of providing an automatic regulation of the temperature of the heating means for a zero growth of the crystal, followed by an automatic pulling of the crystal, and a cooling of the heating means at the end of the pulling.

2. A process according to claim 1, further comprising a step of detecting a contact between the nucleus and the surface of the bath by finding a singularity in the signals representing the weight of the pin and the nucleus at the time of contact between the nucleus and the surface of the molten products, the amplitudes of said signals and of said singularity being between two predetermined upper and lower limits.

3. A process according to claiim 2 wherein the step of providing automatic regulation of the heating means for a zero growth of the monocrystal, following detection of the singularity, comprises:

determining on the basis of signals supplied by the transducer the differences of weight derivatives relative to time for a predetermined sampling period and then, applying clipping operations to the signals, and applying a proportional and integral action to a function representing said differences in the weight derivatives relative to time, the clipping operations differing as a function of application of the difference of the weight derivative to the proportional action or to the integral action, the thus processed function representing a reference voltage of the heating means for a zero growth of the monocrystal, the amplitudes of the signal supplied by the transducer being between the two predetermined limits during said regulation operation.

4. A process according to claim 3, wherein during a translation of the pin and the crucible, pulling of the monocrystal is attained by a controlled variation of the weight derivatives during pulling by comparing these derivatives with a reference weight derivative, the regulation of the temperature of the heating means being obtained by employing a representative function of the variation between these weight derivatives, and processing the weight derivatives by a proportional and integral action with different clipping as a function of whether these variations are applied to a proportional term or to an integral term, the processing of the weight derivatives producing a voltage for regulating the heating means for a controlled growth of the monocrystal.

5. A process according to claim 4 wherein the weight derivative reference is calculated from geometrical data linked with the physical shape of the crystal to be obtained.

6. A process according to any of the claims 2 to 4, further comprising a step of using as a relevant regulation signal for the regulation of the temperature, the weight derivative of the crystal, whose growth is to be checked.

7. A process according to claim 6, wherein further comprising a step of improving the signal-to-noise ratio of the weight derivative by a digital filtering process.

8. A process according to claim 7 wherein said step of improving the signal-to-noise ratio comprises a step of taking the weight derivative on an integral number M of sampling periods, and a step of filtering by forming a mean value of sliding values of the weight derivatives of size N, N being an integer.

9. A process according to claim 8 wherein a sliding mean value is dependent on the sampling rate.

10. A process according to claim 9, wherein the optimum of the signal-to-noise ratio is reached for $M=N/2$ and for a minimum sampling period.

11. A process according to claim 3, wherein the temperature of the heating means is lowered when the amplitudes of the signals supplied by the transducer are below the lower limit, this temperature being increased when the amplitudes of the signals supplied by the transducer are above the upper limit.

12. A process according to either of the claims 4 or 11 further comprising an interrupting of computer controls in the case of an incident, or for introducing new regulating or pulling parameters into the memory.

* * * * *